United States Patent
Alpert et al.

(10) Patent No.: US 7,299,442 B2
(45) Date of Patent: Nov. 20, 2007

(54) PROBABILISTIC CONGESTION PREDICTION WITH PARTIAL BLOCKAGES

(75) Inventors: Charles Jay Alpert, Round Rock, TX (US); Zhuo Li, College Station, TX (US); Stephen Thomas Quay, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 11/032,878

(22) Filed: Jan. 11, 2005

(65) Prior Publication Data

US 2006/0156266 A1    Jul. 13, 2006

(51) Int. Cl.
*G06F 17/50* (2006.01)
(52) U.S. Cl. .............. 716/12; 716/13; 716/14
(58) Field of Classification Search .......... 716/12–14
See application file for complete search history.

(56) References Cited

U.S. PATENT DOCUMENTS 6,952,815 B2 * 10/2005 Teig et al. ............... 716/14
2003/0233627 A1 * 12/2003 Konno et al. ............ 716/14

OTHER PUBLICATIONS

J. Westra et al., "Probabilistic Congestion Prediction", Proceedings of ISPD, pp. 204-209 (Apr. 2004).
J. Lou et al., "Estimating Routing Congestion Using Probabilistic Analysis", IEEE Transactions on CADICS, vol. 21, No. 1, pp. 32-41 (Jan. 2002).

* cited by examiner

*Primary Examiner*—Stacy Whitmore

(74) *Attorney, Agent, or Firm*—Casimer K. Salys; Jack V. Musgrove (57) ABSTRACT

A method of estimating routing congestion between pins in a net of an integrated circuit design, by establishing one or more potential routes between the pins which pass through buckets in the net, assigning a probabilistic usage to each bucket based on any partial blockage of the wiring tracks in each bucket, and computing routing congestion for each bucket using its probabilistic usage. When the net is a two-pin net that is a part of a larger multi-pin net, and a tree is constructed to bridge the two-pin net to another pin of the multi-pin net. The routing congestion for each bucket is computed as a ratio of the bucket usage to bucket capacity. For L-shaped routes (having at least one bend in a bucket), the probabilistic usage is proportional to a scale factor a which is a ratio of a minimum number of available wiring tracks for a given route to a sum of minimum numbers of available wiring tracks for all possible routes. For Z-shaped routes (having at least two bends in two respective buckets), the probabilistic usage is equal to a ratio of a minimum capacity of a given route to a sum of minimum capacities of all routes having an associated orientation with the given route. Assignment of the usage values may entail the creation of a temporary usage map of the net buckets with an initial value of zero usage in every temporary usage map bucket, thereafter storing usage values in corresponding buckets of the temporary usage map, and deriving a final usage map from the temporary usage map.

18 Claims, 7 Drawing Sheets

PROBABILISTIC CONGESTION PREDICTION WITH PARTIAL BLOCKAGES

BACKGROUND OF THE INVENTION

1. Field of the Invention

The present invention generally relates to the fabrication and design of semiconductor chips and integrated circuits, and more specifically to routing tools which predict wire congestion.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates, insert buffers, clone gates, etc., so the area of logic in the design remains fluid. However, physical synthesis can take days to complete.

Routability is a key factor when performing floorplanning or trying to close on timing via physical synthesis. A designer can expend considerable effort trying to get the design into a good state in terms of timing and signal integrity, only to subsequently find that it is unroutable. Ideally, the designer should be able to invoke a snapshot routability analysis that allows him or her to understand the routability issues involved from making floorplanning or optimization decisions.

During physical synthesis, wire congestion may be examined as part of the routing process. Circuit designers have devised various routing tools to provide reliable congestion information when designing the circuit, including empirical models, global routers, and probabilistic analysis. Among these, only probabilistic routing congestion analysis is particularly efficiently, since it avoids actually performing global routing. Instead, for a given placement, it examines the set of nets in the design and uses probability theory to compute the expected congestion for each routing tile.

In one probabilistic analysis algorithm, all possible pin-to-pin routes within the bounding box of the pins are considered, and each route is assigned an equal usage probability. This approach invariably produces biased congestion towards the middle of the bounding box instead of the periphery. Since routers usually try to minimize the insertion of vias, the periphery of the bounding box actually has more congestion than the interior, so this approach can lead to unsatisfactory results.

Figure 1:
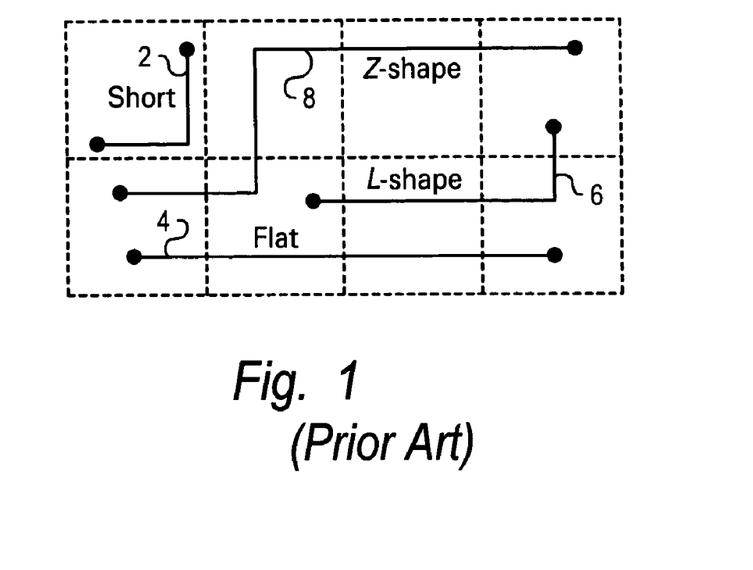
FIG. 1 is a plan view of a net of an integrated circuit design, illustrating different types (shapes) of routes according to the prior art.

In another approach, the probabilistic analysis depends on the different types (shapes) of the routes. Every net is classified into one of four different categories: short nets, flat nets, L-shaped nets, and Z-shaped nets. These types of nets are illustrated in FIG. 1. A short net 2 is a net that locates in one tile or bin. A flat net 4 spans at most one tile in either the vertical or horizontal direction. An L-shaped net 6 or a Z-shaped net 8 spans more than one tile in either direction and have one or two bends, respectively. Probabilistic routing analysis is done exclusively for two-pin nets. Multi-pin nets are broken up into sets of two-pin nets by constructing a tree over the pins. For each net, a number of likely paths is considered and the probabilistic usages are assigned to each bin in the bounding box of the net. The net can be seen as spreading over its possible paths where each path has the same probability. Routing congestion is defined as the ratio of usage to capacity.

While this approach leads to better probabilistic routing usage along the boundary of a net's bounding box, it still does not adequately address the problem of wiring blockages. Before global routing occurs, several requirements may stake claim to wiring resources which then become fixed for global routing. These requirements include local wiring on the bottom layers for the internal pin connections of a gate, power grids on multiple layers, pre-routed clock wires, planned buses, or datapaths, and hierarchical logic, memory, or propriety (IP) blocks. Those features may already have been completely routed; even if not, their routes may be hidden from the top-level routing congestion map. The corresponding bins are unlikely to block 100% of the routing resources since generally there will be some routing resources allocated on the top layers.

Wiring blockage for a given bin can be complete, or partial. Complete blockages can be handled by simply omitting the bin from the possible paths. In practice, however, blockages with absolutely no available tracks are rarely seen, and previous approaches fail to realistically model that essentially every tile of a routing congestion map is neither completely empty or completely full. There is almost always some amount of wiring blockage that a global router will take into account, yet probabilistic routers do not take this reality into account. In conventional probabilistic analysis, if there are partial blockages in some bins, the usage of these bins is not changed at all. Rather, a simple model is applied in which the number of blocked tracks are subtracted from the capacity of the bin. A global router is thus more likely to route a net in a lower congestion region than in a higher one.

In light of the foregoing, it would be desirable to devise an improved probabilistic method of predicting wire congestion which provides a practical approach to handling partial wiring blockages. It would be further advantageous if the method could improve the complexity the probabilistic analysis while still maintaining quality routing solutions.

SUMMARY OF THE INVENTION

It is therefore one object of the present invention to provide an improved method of predicting wiring congestion when modeling routes of a net of an integrated circuit design.

It is another object of the present invention to provide such a method which takes into consideration partial wiring blockages in the net.

It is yet another object of the present invention to provide fast and accurate routing congestion estimation using a probabilistic metric that is more efficient than a global router but still achieves comparable results.

The foregoing objects are achieved in a method of estimating routing congestion between pins in a net of an integrated circuit design, by establishing one or more potential routes between the pins which pass through buckets in the net (each bucket having a set of wiring tracks), assigning a probabilistic usage to each bucket based on any partial blockage of the wiring tracks in each bucket, and computing routing congestion for each bucket using its probabilistic usage. When the net is a two-pin net that is a part of a larger multi-pin net, and a tree is constructed to bridge the two-pin net to another pin of the multi-pin net. The routing congestion for each bucket is computed as a ratio of the bucket usage to bucket capacity. For L-shaped routes (having at least one bend in a bucket), the probabilistic usage is proportional to a scale factor a which is a ratio of a minimum number of available wiring tracks for a given route to a sum of minimum numbers of available wiring tracks for all possible routes. For Z-shaped routes (having at least two bends in two respective buckets), the probabilistic usage is equal to a ratio of a minimum capacity of a given route to a sum of minimum capacities of all routes having an associated orientation with the given route. In particular, the minimum capacity F(n) of the given route n is $$F(n) = \min\{F(u_1) \cdot F(i\ d_n)/F_R(d_1), \ldots, F(u_n) \cdot F(d_n)/F_R(d_n), F(d_n), F(e_n) \cdot F(d_n)/F_L(d_n), \ldots, F(e_Q) \cdot F(d_Q)/F_L(d_Q)\},$$

where Q is the number of potential routes, d is one of a plurality of central span portions of the potential routes, u is one of a first plurality of edge portions of the potential routes that lie on a first side of the central span portions, e is one of a second plurality of edge portions of the potential routes that lie on a second side of the central span portions, $F(u_n)$ is the capacity associated with edge $u_n$, $F(d_n)$ is the capacity associated with edge $d_n$, $F(e_n)$ is the capacity associated with edge $e_n$, $F_L(d_n)$ is the total capacities of all central spans d to the left of span $d_n$ having an associated orientation with the given route, and $F_R(d_n)$ is the total capacities of all central spans d to the right of span $d_n$ having the associated orientation with the given route. Assignment of the usage values may entail the creation of a temporary usage map of the net buckets with an initial value of zero usage in every temporary usage map bucket, thereafter storing usage values in corresponding buckets of the temporary usage map, and deriving a final usage map from the temporary usage map.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
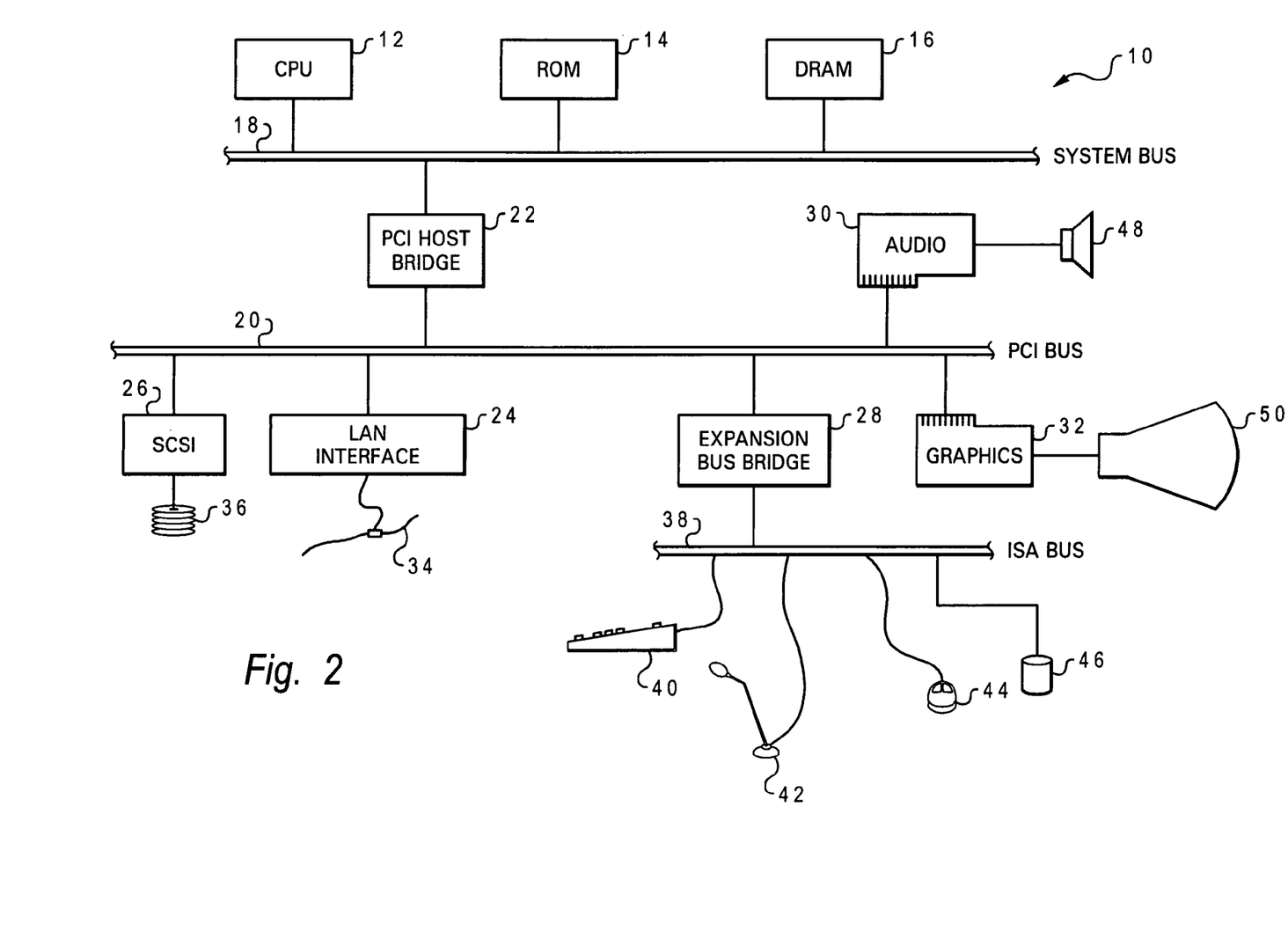
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system programmed to carry out computer-aided design of an integrated circuit in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the integrated circuit design as taught herein.

While the illustrative implementation provides the program instructions embodying the present invention on disk drive 36, those skilled in the art will appreciate that the invention can be embodied in a program product utilizing other computer-readable media, including transmission media. The program instructions may be written in the C++ programming language for an AIX environment.

Computer system 10 carries out program instructions for an interconnect optimization process which predicts wire congestion using a novel method that includes consideration of partial wiring blockages. Accordingly, a program embodying the invention may include conventional aspects of various placement and timing tools, and these details will become apparent to those skilled in the art upon reference to this disclosure.

Figure 3:
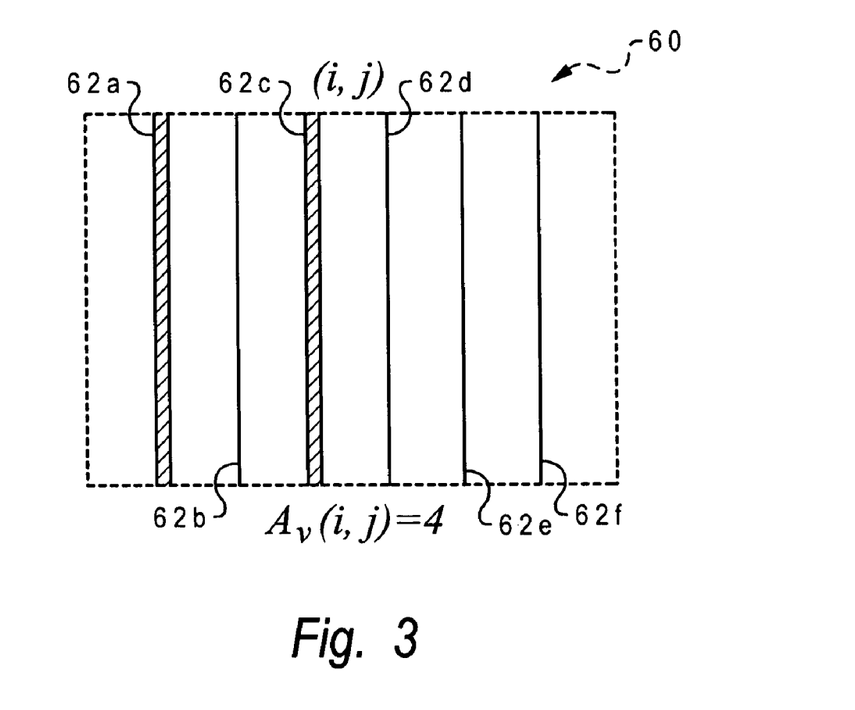
FIG. 3 is a plan view of a bin in a net route which has partial wiring blockage as viewed in accordance with one implementation of the present invention.

In one embodiment, computer system 10 divides the layout of the integrated circuit (IC) chip into rows and columns of buckets (tiles or bins). As illustrated in FIG. 3, each bucket 60 contains a set of wiring tracks 62a-62f. The height and width of all buckets are assumed to be same, and defined as H and W; the bucket size can be varied to trade off speed for solution quality. An exemplary bucket size is 30×30 wiring tracks. The distance between the left, right, bottom, or top border of a bucket and a pin p is denoted by $l_p$, $r_p$, $b_p$, and $t_p$, respectively. The pin's coordinates are given by $(x_p, y_p)$. A 2-pin net f may span a number of buckets. The number of horizontal and vertical buckets net f spans are defined as the width and height of the bounding box containing f, respectively. In the discussion that follows, $U_h^f(i,j)$ and $U_v^f(i,j)$ are the horizontal and vertical usages due to a net f in the bucket with coordinates (i,j), wherein the i coordinate is the vertical direction and the j coordinate is the horizontal direction. The available horizontal and vertical capacities of the bucket at (i,j), denoted as $A_h(i,j)$ and $A_v(i,j)$, are the number of available horizontal and vertical wiring tracks 62 inside the bucket. In the example of FIG. 3, $A_v(i,j)$ is four, that is, four of the wire tracks are available (62b, 6d, 62e and 62f) and two have partial blockages as indicated with darkened lines (62a, 62c). The probabilistic horizontal and vertical congestion of a bucket is defined as the ratio of its total probabilistic usages contributed by all nets to its available capacity. In this implementation, the terms congestion and usage represents an average of horizontal and vertical congestion and usage. The probabilistic computations for each of the four different classes of nets (short, flat, L-shaped, and Z-shaped) proceed with the conventional assumption that the two pins of a net lie in the lower-left and upper-right corners of their bounding boxes.

Multi-pin nets are broken up into sets of two-pin nets by constructing either a minimum spanning tree (MST) or rectilinear Steiner tree (RST) to bridge the pins. The results can reflect pin-to-pin, pin-to-Steiner, or Steiner-to-Steiner congestion.

Figure 4:
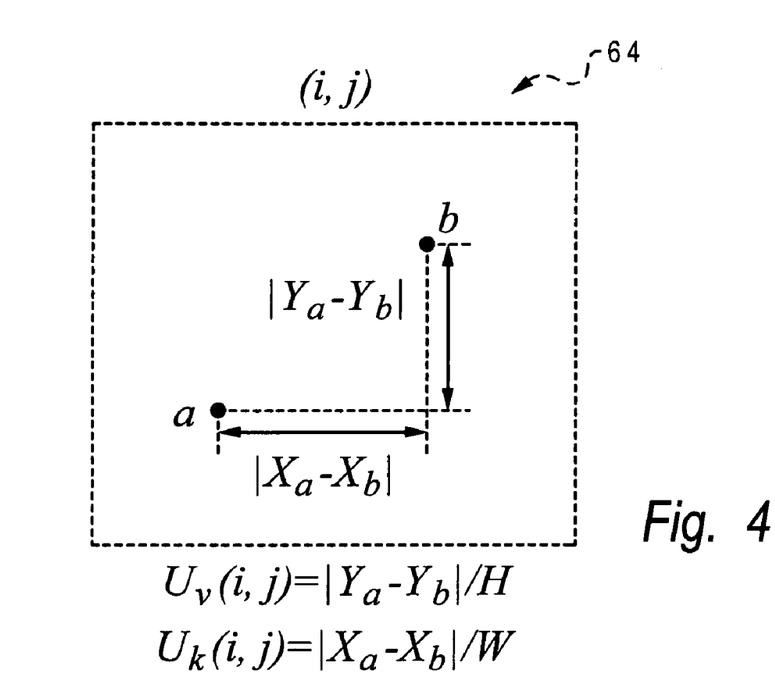
FIG. 4 is a plan view of a short net located in a single tile or bin, which is analyzed for wire congestion in accordance with one implementation of the present invention.

FIG. 4 illustrates a short net 64, that is, a net having two pins a and b located in a single tile. Short nets are the easiest to analyze, and may be handled conventionally by computing horizontal (vertical) usage as the horizontal (vertical) span of the net divided by the width (height) of the bucket.

Figure 5:
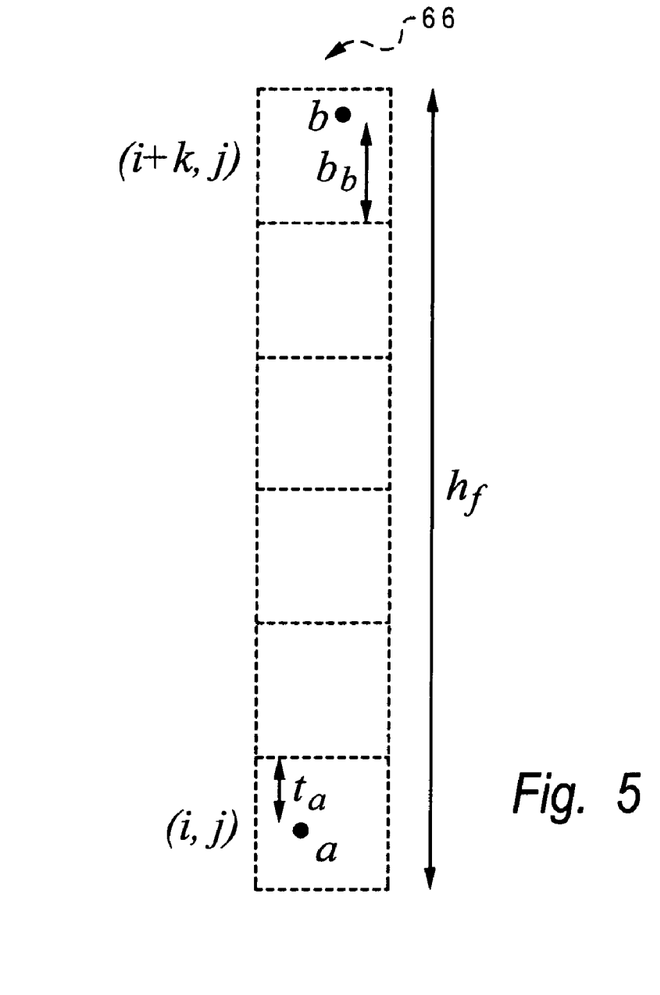
FIG. 5 is a plan view of a flat net spanning at most one tile in either the vertical or horizontal direction, which is analyzed for wire congestion in accordance with one implementation of the present invention.

FIG. 5 illustrates a flat net 66, that is, a net that spans at most one tile in either the vertical or horizontal direction (a horizontal or vertical flat net). Net 66 is shown as a vertical flat net that spans from (i,j) to (i+k,j). The vertical usage $U_v$ of each bucket may be computed conventionally as $$U_v(i,j) = t_a/H,$$

$$U_v(i+k,j) = b_b/H, \text{ and}$$

$$U_v(i+m,j) = 1, \text{ for } 0 < m < k.$$

The wire traveling through the bucket will occupy a full vertical track.

The short horizontal route between a and b in the vertical flat net 66 could occur in any of the buckets. In the illustrative implementation, it is deemed more likely to occur in a bucket with less partial routing blockage. In particular, the horizontal usage $U_h$ of each bucket may be made proportional to the available routing capacity $$U_h(i+m,j) = [|x_a - x_b| \cdot A_h(i+m,j)]/(W \cdot S), \text{ for } 0 \leq m \leq k,$$

where $S = \Sigma_{m=0}^{k} A_h(i+m,j)$. If one assumes equal bucket capacities, this formula reduces to $$U_h(i+m,j) = |x_a - x_b|/Wh_f, \text{ for } 0 \leq m \leq k.$$

Figure 6:
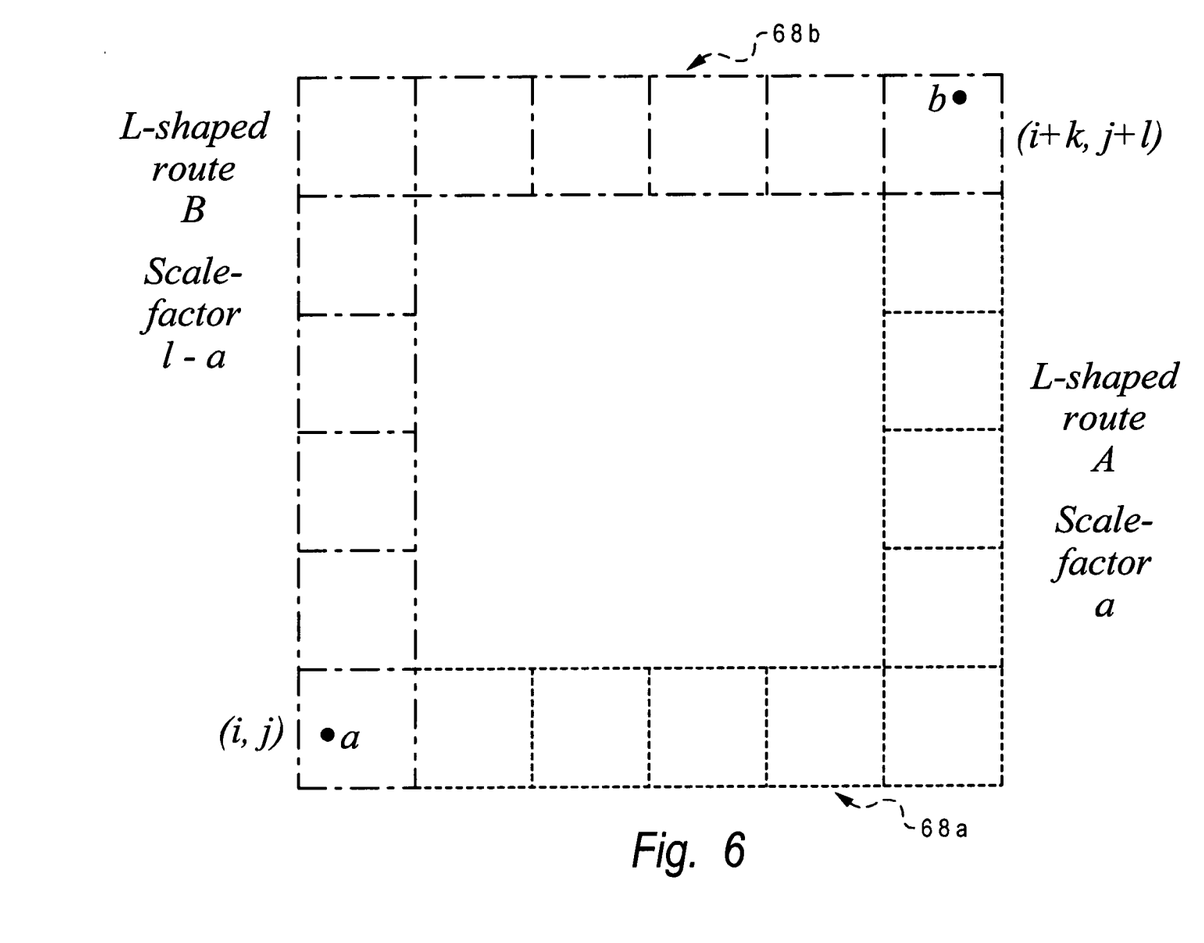
FIG. 6 is a plan view of an L-shaped net, which is analyzed for wire congestion in accordance with one implementation of the present invention.

L-shaped nets with $w_f > 1$ and $h_f > 1$ have at least one bend. An L-shaped route generally has two possible configurations 68a and 68b as shown in FIG. 6. The probability of using route A is denoted as α, and the probability of using route B is 1−α. Conventional congestion analysis effectively assumes that α is 0.5, but if one of the two routes has more wiring blockage than the other, then the present invention assigns an alternative value. The number of available tracks $S_{hA}$ and $S_{vA}$ at the horizontal and vertical directions for L-shaped route A may be given as $$S_{hA}=\min_{0\leq n\leq l}A_h(i,j+n), \text{ and}$$

$$S_{vA}=\min_{0\leq m\leq k}A_v(i+m,j+1).$$

The number of available tracks $S_{hB}$ and $S_{vB}$ at the horizontal and vertical directions for L-shaped route B are derived similarly. The scale factor $\alpha$ is then defined as $$\alpha=\min(S_{hA}, S_{vA})/[\min(S_{hA}, S_{vA})+\min(S_{hB}, S_{vB})].$$

The horizontal and vertical usage of each bucket on route A in FIG. 6 may be computed conventionally as $$U_h(i,j)=r_a/W$$

$$U_h(i,j+l)=l_b/W$$

$$U_v(i,j+l)=t_a/H$$

$$U_v(i+k,j+l)=b_b/H$$

$$U_h(i,j+n)=1, \text{ for } 0<n<l$$

$$U_v(i+m,j+l)=1, \text{ for } 0<m<k.$$

Figures 7, 8:
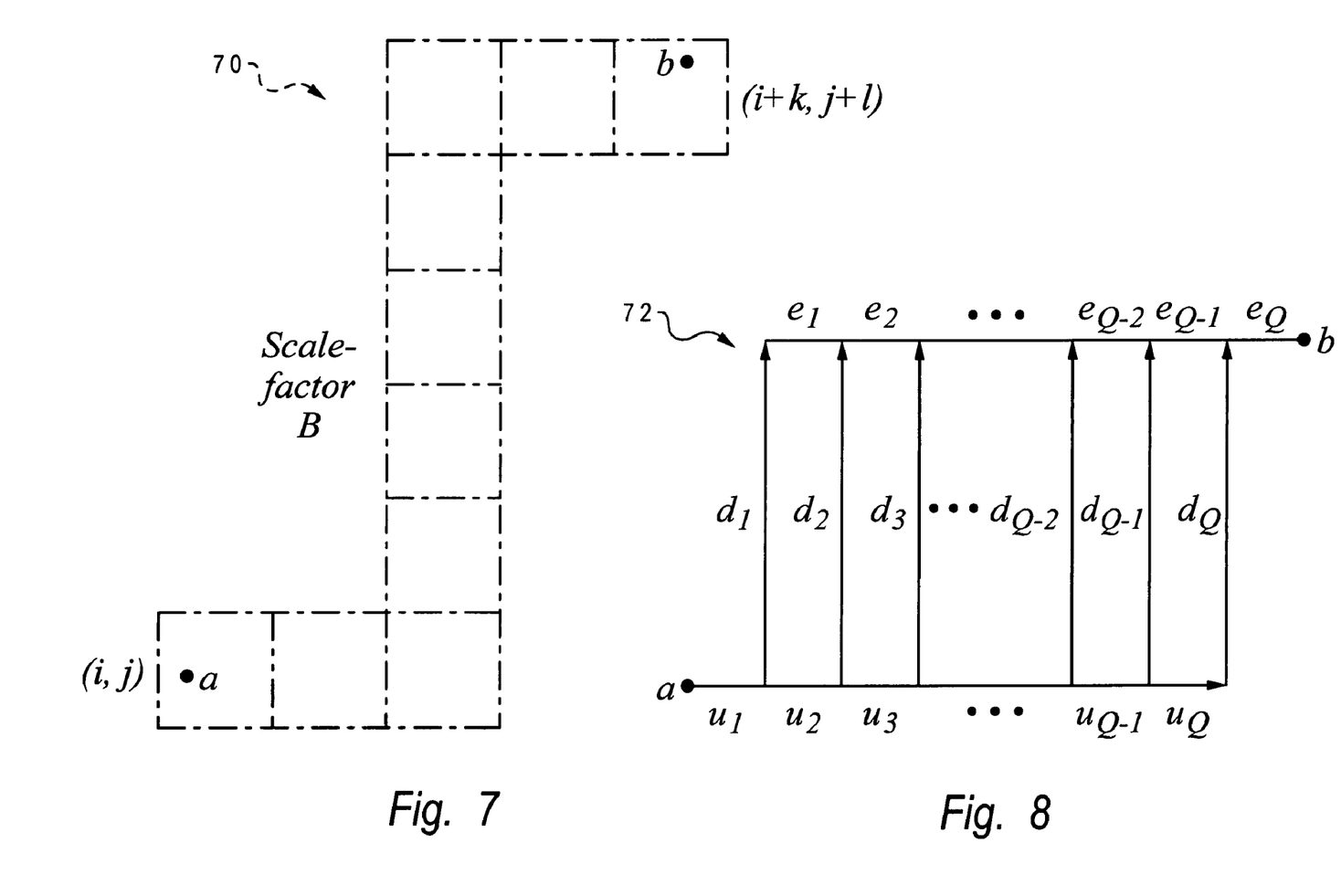
FIG. 7 is a plan view of a Z-shaped net, which is analyzed for wire congestion in accordance with one implementation of the present invention.
FIG. 8 is a generalized routing graph for a Z-shaped net constructed in accordance with one implementation of the present invention.

L-shaped nets with $w_f=h_f=2$ are different from other L-shaped nets since no Z-shape is possible. However, if both $w_f$ and $h_f$ are greater than 2, there can be two different Z-shaped orientations, denoted horizontal and vertical, based on the orientation of the center span of the Z-shapes. A generalized vertical Z-shaped net 70 is illustrated in FIG. 7. A routing graph 72 which shows all possible choices for vertical Z-shaped net 70 is also shown in FIG. 8 (a directed graph). The number of possible Z-shapes (different vertical spans) is given by the number $Q=w_f-2$. Each edge $u_n$ corresponds to a part of the net entering from the bucket (i,j+n−1) to the bucket (i,j+n), each edge $d_n$ corresponds to a part of the net entering from the bucket (i,j+n) to the bucket (i+k,j+n), and each edge $e_n$ corresponds a part of the net entering from the bucket (i+k,j+n) to the bucket (i+k,j+n+1) for n=1, ... , Q. There is a capacity F associated with each edge, where $$F(u_n)=\min(A_h(i,j+n-1), A_h(i,j+n)),$$

$$F(d_n)=\min_{0\leq m\leq l}A_v(i+m,j+n), \text{ and}$$

$$F(e_n)=\min(A_h(i+k,j+n), A_h(i+k,j+n+1)).$$

Given Q possible routes denoted as $R(n)=\{u_l, \ldots, u_n, d_n, e_n, \ldots, e_Q\}$ for n=1, ... , Q, a vertical Z-shaped net routed by a global router must be one of shape R(n). The present invention utilizes the probability of a vertical Z-shaped net routed with the shape R(n), denoted as P(n). The value for P(n) must satisfy two properties: $0\leq P(n)\leq 1$, for n=1, ... , Q; and $\Sigma^Q_{n=1} P(n)=1$. If these probabilities are already known, then the usage of each bucket can be derived as follows.

For the leftmost bucket in the bottom row, the horizontal and the vertical cost are $$U_h(i,j)=r_a/W,$$

$$U_v(i,j)=0.$$

For the other buckets in the bottom row, the horizontal usage consists of two terms. The first term is for the case in which the vertical segment d(n) on route R(n) will start in this bucket. The horizontal usage in that case is 0.5 since the bend would on average be in the middle of the bucket. The other term is for the case in which d(n) is at the right of the bucket, and the usage is 1. A bucket has vertical usage only if the bend occurs in that bucket. The total vertical usage ($t_a/H$) is spread over the candidate buckets. Therefore, the usages can be defined as $$U_h(i,j+n)=P(n)/2+P_R(n), \text{ and}$$

$$U_v(i,j+n)=t_a\cdot P(n)/H, \text{ for } 1\leq n\leq l,$$

where $P_R(n)=\Sigma^Q_{m=n+1} P(m)$.

For the top row, the derivation is similar. Horizontal bucket usage consists of two terms, one for the case wherein the bend occurs in that bucket, and one for the case wherein the bend occurs to its left. Vertical usage is spread over the buckets. The horizontal and vertical cost for these buckets are $$U_h(i+k, j+l) = l_b/W,$$

$$U_v(i+k, j+l) = 0,$$

$$U_h(i+k, j+n) = P(n)/2 + P_L(n), \text{ for } 1 \leq n < l, \text{ and}$$

$$U_v(i+k, j+n) = b_b \cdot P(n)/H, \text{ for } 1 \leq n < l,$$

where $P_L(n) = \sum_{m=1}^{n-1} P(m)$.

The horizontal and vertical usage for bucket (i+m,j+n) in the center of the netbox are $$U_v(i+m,j+n)=P(n), \text{ and}$$

$$U_h(i+m,j+n)=0,$$

where $0<m<k$, and $0\leq n\leq l$.

The total "Z-usage" can be found using another scale factor $\beta$, which is a function of the total capacities of vertically and horizontally oriented Z-shapes, $S_v$ and $S_h$. In the illustrative implementation, the horizontal and vertical Z-usages are scaled with $\beta=S_h/(S_h+S_v)$ and $1-\beta=S_v/(S_h+S_v)$, respectively, as was done with scale factor $\alpha$ for the L-shapes, and then summed.

Figure 9A:
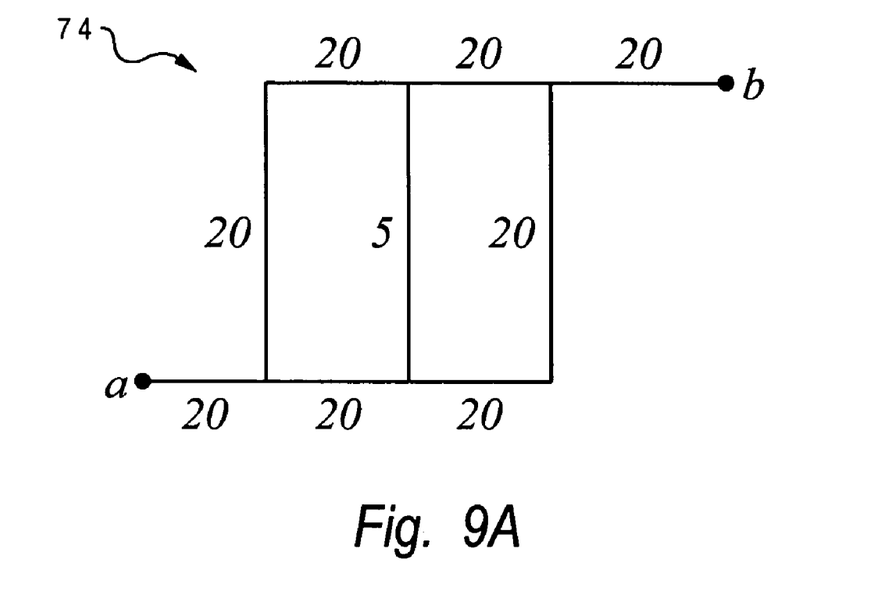
FIGS. 9A and 9B are routing graphs for two examples of wire congestion prediction for Z-shaped nets in accordance with one implementation of the present invention.

As mentioned in the Background section, the conventional approach is to assign each route an equal usage probability, i.e., P(n)=1/Q for every route, n=1, ... , Q, and $\beta=(w_f-2)/(w_f+h_f-4)$. This assumption is valid only when there is no partial blockage. For example, in the routing graph 74 of FIG. 9A, three are three possible L-shapes, so each route has the same probability of ⅓ according to the prior art. However, it is more intuitive for a global router to route a net in an area with less wiring blockages. The present invention utilizes a novel metric to define P(n) that takes into consideration the partial blockage information. There are many different assumptions that one could make that lead to different probabilities assigned to routes, but the preferred embodiment defines P(n) based on the minimum capacities of each route. For each vertical Z-shaped route R(n), its probability P(n) is $$P(n)=F(n)S_v,$$

where F(n) is the minimum capacity of route R(n) and $S_v=\Sigma^Q_{n=1} F(n)$ is the total minimum capacities of all the vertical Z-shaped routes. The minimum capacity F(n) is related to the capacities of every edge on route R(n). However, for every edge $u_m$ (for m=1, ... , Q) its capacity is shared by Q−m−1 routes, and for every edge $e_m$ (for m=1, ..., Q) its capacity is shared by m routes. Therefore, for one specific route R(n), it is hard to know the exact capacities of edge $u_m$ and $e_m$ that are contributed to R(n). If the capacities of all u and e edges are infinite, F(n) is equal to the capacity of a unique edge $d_n$ of each route. In other cases, for each route R(n), n=1, ..., Q, the capacity of every edge $u_m$ (for m=1, ..., n) on route R(n) is redistributed according to the ratio between the capacity of unique edge $d_n$ of R(n) and the total capacities of all unique edges of routes sharing edge $u_m$. The capacity of every edge $e_m$ (for m=n, ..., Q) is redistributed in a similar way. After deriving the new capacity of every edge on route R(n), the minimum capacity F(n) can be easily computed.

The total vertical capacities all edges d to the left and right of edge $d_n$, including edge $d_n$ itself, are denoted as $F_L(d_n)$ and $F_R(d_n)$ for n=1, ..., Q, and are defined as $$F_L(d_n) = \sum_{m=1}^{n} F(d_m), \text{ and } F_R(d_n) = \sum_{m=n}^{Q} F(d_m).$$

The minimum capacity F(n) of each route R(n) (for n 1, ..., Q) can be computed as $$F(n)=\min\{F(u_1)\cdot F(d_n)/F_R(d_1), \ldots, F(u_n)\cdot F(d_n)/F_R(d_n), F(d_n), F(e_n)\cdot F(d_n)/F_L(d_n), \ldots, F(e_Q)\cdot F(d_Q)/F_L(d_Q)\},$$

which can be rewritten as $$F(n)=F(d_n)\cdot\min\{K_u(n), 1, K_e(n)\},$$

where $$K_u(n)=\min\{F(u_1)/F_R(d_1), \ldots, F(u_n)/F_R(d_n)\}, \text{ and}$$

$$K_e(n)=\min\{F(e_n)/F_L(d_n), \ldots, F(e_Q)/F_L(d_Q)\}.$$

Similar analysis can be done for horizontal Z-shaped routes, and $S_h$ and β can be derived accordingly. When there are no partial blockages and the capacities of each bucket are same, this model degenerates into the aforementioned conventional approach for P(n).

Returning to FIG. 9A, in that example the minimum capacities are given as $F_L(d_1)=F_R(d_3)=20$, $F_L(d_2)=F_R(d_2)=25$, and $F_L(d_3)=F_R(d_1)=45$. Substituting these values in the foregoing equations yield $$F(1)=20\cdot\min(20/45, 1, 1, 20/25, 20/45)=400/45,$$

$$F(2)=5\cdot\min(20/45, 20/25, 1, 20/25, 20/45)=100/45,$$
and $$F(3)=400/45.$$

These capacities results in usage probabilities of P(1)=4/9, P(2)=1/9 and P(3)=4/9. Compared to the prior art approach of assigning equal probabilities to each route, the probability of path R(2) is reduced by 2/9 which is evenly distributed to R(1) and R(3). If 20 two-pin nets are routed in this example where all lower left pins are in the same bucket, and all upper right pins are in the same bucket, then the vertical probabilistic congestion of $d_1$, $d_2$ and $d_3$ would be 4/9·20/20=4/9, 1/9 20/5=4/9, and 4/9·20/20=4/9, respectively. Comparable congestion of $d_1$, $d_2$ and $d_3$ derived from the conventional method would be 1/3, 4/3 and 1/3, respectively. The present invention thus predicts that the congestion for all three routes is equal. This outcome is more likely to occur since this solution leaves even space for each route and predicts that the router will take less probability to route this Z-shaped net with the second route.

Figure 9B:
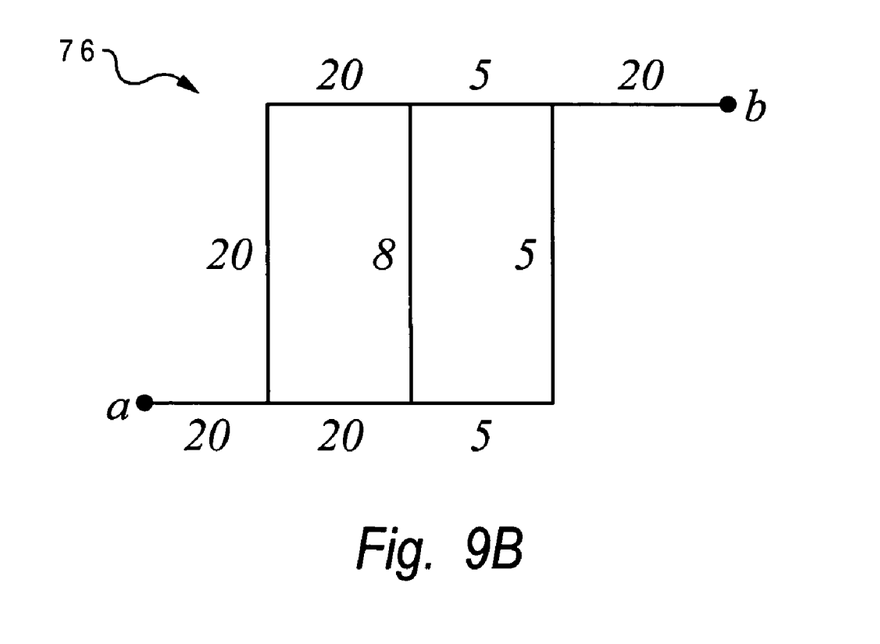

Another example is illustrated in FIG. 9B, wherein $F_L(d_1)=20$, $F_R(d_3)=5$, $F_L(d_2)=28$, $F_R(d_2)=13$, $F_L(d_3)=F_R(d_1)=33$, leading to F(1)=100/28, F(2)=40/28 and F(3)=100/33, and P(1)=0.4447, P(2)=0.1779 and P(3)=0.3774. If 10 two-pin nets are routed in this example where all lower left pins are in the same bucket, and all upper right pins are in the same buckets, then the horizontal probabilistic congestion of $e_2$ (the edge on the top row with capacity 5) is 0.996 compared to 1.067 derived from the conventional approach. The metric of the present invention thus places more routes on the third path than the second since the first path occupies most of tracks of $e_2$ and therefore the usage probability of the second path is decreased.

It is useful to decide what the relative probabilities of L-shapes versus Z-shapes should be, since the analysis must assume that a certain number are L-shaped and a certain number are Z-shaped. The probability of taking an L-route over a Z-route can be expressed as a parameter $\gamma=\#nets_L/(\#nets_L+\#nets_Z)$. The value for γ can be chosen by previous design experience, i.e., how many routes are optimally routed or fixed by the designer. Actual routing results can be examined to determine a reasonable percentage. The combination probabilistic usages are $U_{LZ}=\gamma U_L+(1-\gamma)U_Z$.

The following algorithm can be used to predict the congestion map of a given set N of nets in accordance with the foregoing:

| | |
|---|---|
| 1: | Create maps with loaded partial wiring blockage |
| 2: | For each net f ∈ N |
| 3: | pin-pairs = MST(n) or pin-pairs = RST(n) |
| 4: | For each pin-pair (a, b) |
| 4: | If (a, b) is a short net |
| 5: | update short-congestion((a, b)) |
| 6: | Else if (a, b) is a flat net |
| 7: | update flat-congestion((a, b)) |
| 8: | Else |
| 9: | update γ × L-shape-congestion((a, b)) |
| 10: | update (1 − γ) × Z-shape-congestion((a, b)) |

It is easy to see that for short nets, flat nets and L-shaped nets the algorithm takes linear time with respect to the maximum between horizontal buckets and vertical buckets the net spans, $\max(w_f, h_f)$. For Z-shaped nets, it is also easy to prove that with dynamic programming it takes a time-complexity of $O(\max(w_f, h_f))$ in the bounding box to compute all of the $F_L(d_n)$, $F_R(d_n)$, $K_u(n)$, $K_e(n)$, F(n), P(n), $P_L(n)$ and PR(n) values for both vertical and horizontal Z-shaped nets, i.e., $F_L(d_n)=F_L(d_{n-1})+F(d_1)$ (the time-complexity value O indicates how the algorithm scales with time). It also takes $O(\max(w_f, h_f))$ to update the usage value of the top and bottom rows for the vertical Z-shaped net, and the left and right columns for the horizontal Z-shaped net. However, it still takes $O(w_j \cdot h_f)$ time to update the usage value for all other buckets, which results in the complexity O(#nets·#buckets) as proposed in the prior art. This complexity can, however, be improved. Using a vertical Z-shaped net as an example, we know that the horizontal usages for all center buckets are zero. The vertical usage for all buckets on an edge $d_n$ are as given above, which is P(n). Instead of updating these buckets explicitly, for all buckets in one column, a temporary usage map may be created with an initial value of zero in every bucket. A positive value is then stored before bucket (i,j+n), e.g., P(n), and a negative value is stored after bucket (i+k−1, j+n), e.g., −P(n). After obtaining this temporary map, the usage of each bucket in the final map can be derived by scanning from the first bucket in the temporary map and summing up all usage values in the temporary map that occur before this bucket. Experimental results show that predicted congestion according to the present invention matches quite well with the real congestion seen by a global router.

Figure 10:
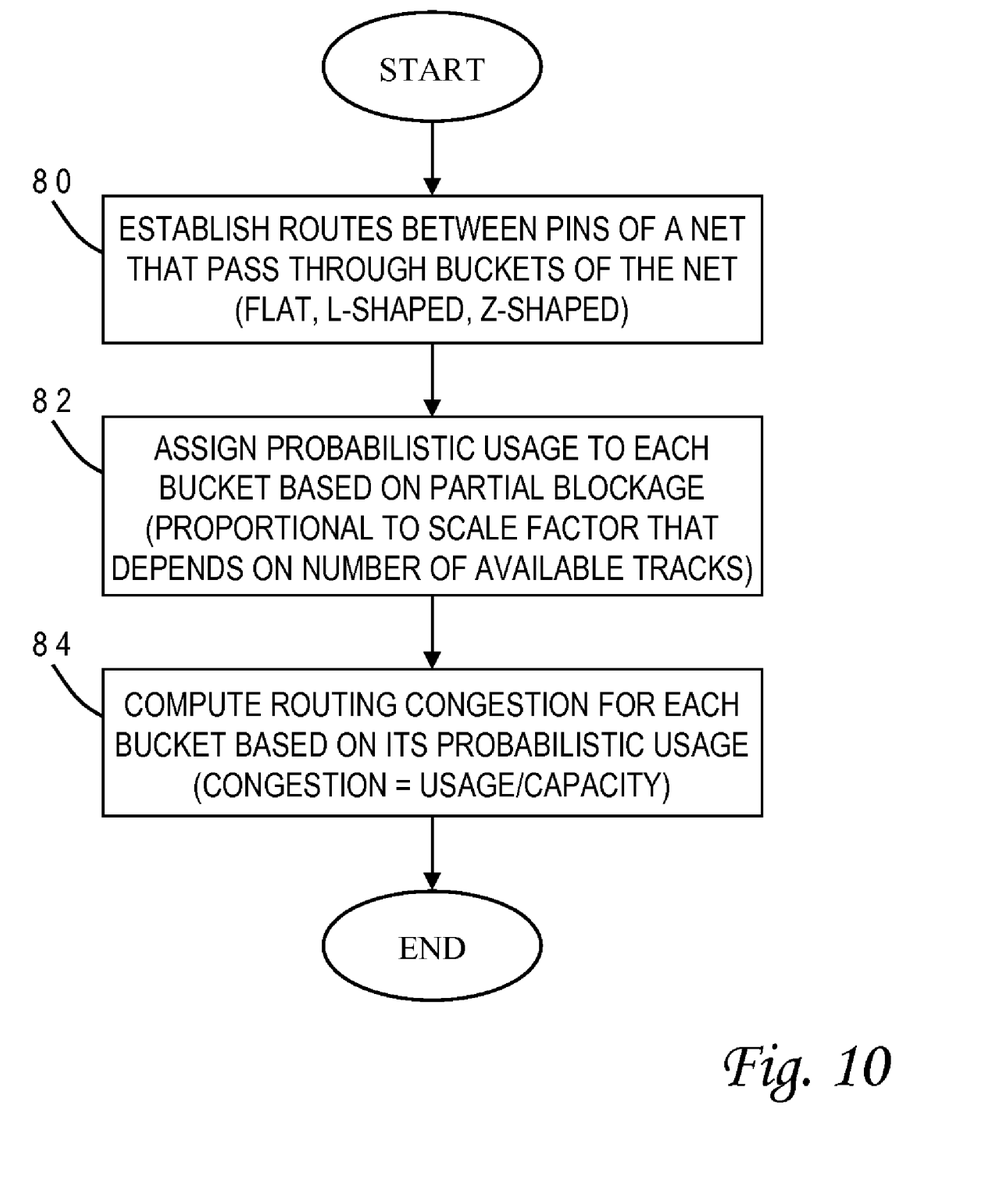
FIG. 10 is a chart illustrating the logical flow of the invention according to one implementation.

The invention may be further understood with reference to the flow chaff of FIG. 10. The process for estimating routing congestion begins by establishing routes betweens pins of a net that pass through buckets of the net (80). The route may be flat, L-shaped or Z-shaped (short routes are handled conventionally). A probabilistic usage is then assigned to each bucket based on any partial blockage of the bucket (82). The usage is proportional to a scale factor that depends on the number of available tracks: for a flat route, the usage is proportional to the available routing capacity; for an L-shaped route, the usage is proportional to the scale factor α which is a ratio of a minimum number of available wiring tracks for a given route to a sum of minimum numbers of available wiring tracks for all possible routes; and for a Z-shaped route the usage is proportional to a ratio of a minimum capacity of a given route to a sum of minimum capacities of all routes having an associated orientation with the given route. The routing congestion is then computed for each bucket based on its probabilistic usage (84). In this implementation, the congestion is defined as the ratio of the probabilistic usage to the available capacity.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been described in the context of particular shaped nets, it could be implemented for other shapes as well. It is therefore contemplated that such modifications can be made without departing from the spirit or scope of the present invention as defined in the appended claims.

What is claimed is:

1. A method of estimating routing congestion between pins in a net of an integrated circuit design using a computer system, comprising:

establishing one or more potential routes between the pins which pass through one or more buckets in the net, each bucket having a set of wiring tracks;

assigning a probabilistic usage to each bucket based on any partial blockage of the wiring tracks in each bucket, wherein said assigning includes creating a temporary usage map of the net buckets with an initial value of zero usage in every temporary usage map bucket, storing usage values in corresponding buckets of the temporary usage map, and deriving a final usage map from the temporary usage map;

computing routing congestion for each bucket using its probabilistic usage; and storing the routing congestion for each bucket in said computer system.

2. The method of claim 1 wherein the net is a two-pin net that is a part of a larger multi-pin net, and further comprising constructing a tree to bridge the two-pin net to another pin of the multi-pin net.

3. The method of claim 1 wherein the routing congestion for each bucket is computed as a ratio of the bucket usage to bucket capacity.

4. The method of claim 1 wherein the routes are L-shaped having at least one bend in a bucket, and the probabilistic usage is proportional to a scale factor α which is a ratio of a minimum number of available wiring tracks for a given route to a sum of minimum numbers of available wiring tracks for all possible routes.

5. The method of claim 1 wherein the routes are Z-shaped having at least two bends in two respective buckets, and the probabilistic usage is equal to a ratio of a minimum capacity of a given route to a sum of minimum capacities of all routes having an associated orientation with the given route.

6. The method of claim 5 wherein the minimum capacity $F(n)$ of the given route n is $$F(n)=\min\{F(u_1)\cdot F(d_n)/F_R(d_1), \ldots, F(u_n)\cdot F(d_n)/F_R(d_n), F(d_n), F(e_n)\cdot F(d_n)/F_L(d_n), \ldots, F(e_Q)\cdot F(d_Q)/F_L(d_Q)\},$$

where Q is the number of potential routes, d is one of a plurality of central span portions of the potential routes, u is one of a first plurality of edge portions of the potential routes that lie on a first side of the central span portions, e is one of a second plurality of edge portions of the potential routes that lie on a second side of the central span portions, $F(u_n)$ is the capacity associated with edge $u_n$, $F(d_n)$ is the capacity associated with edge $d_n$, $F(e_n)$ is the capacity associated with edge $e_n$, $F_L(d_n)$ is the total capacities of all central spans d to the left of span $d_n$ having an associated orientation with the given route, and $F_R(d_n)$ is the total capacities of all central spans d to the right of span $d_n$ having the associated orientation with the given route.

7. A computer system comprising:

one or more processors which process program instructions;

a memory device connected to said processing means; and program instructions residing in said memory device for estimating routing congestion between pins in a net of an integrated circuit design by establishing one or more potential routes between the pins which pass through one or more buckets in the net, each bucket having a set of wiring tracks, assigning a probabilistic usage to each bucket based on any partial blockage of the wiring tracks in each bucket wherein said assigning includes creating a temporary usage map of the net buckets with an initial value of zero usage in every temporary usage map bucket, storing usage values in corresponding buckets of the temporary usage map, and deriving a final usage map from the temporary usage map, and computing routing congestion for each bucket using its probabilistic usage.

8. The computer system of claim 7 wherein the net is a two-pin net that is a part of a larger multi-pin net, and said program instructions further construct a tree to bridge the two-pin net to another pin of the multi-pin net.

9. The computer system of claim 7 wherein the routing congestion for each bucket is computed as a ratio of the bucket usage to bucket capacity.

10. The computer system of claim 7 wherein the routes are L-shaped having at least one bend in a bucket, and the probabilistic usage is proportional to a scale factor α which is a ratio of a minimum number of available wiring tracks for a given route to a sum of minimum numbers of available wiring tracks for all possible routes.

11. The computer system of claim 7 wherein the routes are Z-shaped having at least two bends in two respective buckets, and the probabilistic usage is equal to a ratio of a minimum capacity of a given route to a sum of minimum capacities of all routes having an associated orientation with the given route.

12. The computer system of claim 11 wherein the minimum capacity F(n) of the given route n is $$F(n)=\min\{F(u_1) \cdot F(d_n)/F_R(d_1), \ldots, F(u_n) \cdot F(d_n)/F_R(d_n), F(d_n), F(e_n) \cdot F(d_n)/F_L(d_n), \ldots, F(e_Q) \cdot F(d_Q)/F_L(d_Q)\},$$

where Q is the number of potential routes, d is one of a plurality of central span portions of the potential routes, u is one of a first plurality of edge portions of the potential routes that lie on a first side of the central span portions, e is one of a second plurality of edge portions of the potential routes that lie on a second side of the central span portions, $F(u_n)$ is the capacity associated with edge $u_n$, $F(d_n)$ is the capacity associated with edge $d_n$, $F(e_n)$ is the capacity associated with edge $e_n$, $F_L(d_n)$ is the total capacities of all central spans d to the left of span $d_n$ having an associated orientation with the given route, and $F_R(d_n)$ is the total capacities of all central spans d to the right of span $d_n$ having the associated orientation with the given route.

13. A computer program product comprising:
a computer-readable medium; and
program instructions residing in said medium for estimating routing congestion between pins in a net of an integrated circuit design by establishing one or more potential routes between the pins which pass through one or more buckets in the net, each bucket having a set of wiring tracks, assigning a probabilistic usage to each bucket based on any partial blockage of the wiring tracks in each bucket wherein said assigning includes creating a temporary usage map of the net buckets with an initial value of zero usage in every temporary usage map bucket, storing usage values in corresponding buckets of the temporary usage map, and deriving a final usage map from the temporary usage map, and computing routing congestion for each bucket using its probabilistic usage.

14. The computer program product of claim 13 wherein the net is a two-pin net that is a part of a larger multi-pin net, and said program instructions further construct a tree to bridge the two-pin net to another pin of the multi-pin net.

15. The computer program product of claim 13 wherein the routing congestion for each bucket is computed as a ratio of the bucket usage to bucket capacity.

16. The computer program product of claim 13 wherein the routes are L-shaped having at least one bend in a bucket, and the probabilistic usage is proportional to a scale factor α which is a ratio of a minimum number of available wiring tracks for a given route to a sum of minimum numbers of available wiring tracks for all possible routes.

17. The computer program product of claim 13 wherein the routes are Z-shaped having at least two bends in two respective buckets, and the probabilistic usage is equal to a ratio of a minimum capacity of a given route to a sum of minimum capacities of all routes having an associated orientation with the given route.

18. The computer program product of claim 17 wherein the minimum capacity F(n) of the given route n is $$F(n)=\min\{F(u_1) \cdot F(d_n)/F_R(d_1), \ldots, F(u_n) \cdot F(d_n)/F_R(d_n), F(d_n), F(e_n) \cdot F(d_n)/F_L(d_n), \ldots, F(e_Q) \cdot F(d_Q)/F_L(d_Q)\},$$

where Q is the number of potential routes, d is one of a plurality of central span portions of the potential routes, u is one of a first plurality of edge portions of the potential routes that lie on a first side of the central span portions, e is one of a second plurality of edge portions of the potential routes that lie on a second side of the central span portions, $F(u_n)$ is the capacity associated with edge $u_n$, $F(d_n)$ is the capacity associated with edge $d_n$, $F(e_n)$ is the capacity associated with edge $e_n$, $F_L(d_n)$ is the total capacities of all central spans d to the left of span $d_n$ having an associated orientation with the given route, and $F_R(d_n)$ is the total capacities of all central spans d to the right of span $d_n$ having the associated orientation with the given route.

* * * * *